United States Patent
Goodwin et al.

(10) Patent No.: US 6,731,505 B1
(45) Date of Patent: May 4, 2004

(54) INTEGRATED CIRCUIT MOUNTING SYSTEM WITH SEPARATE LOADING FORCES FOR SOCKET AND HEAT SINK

(75) Inventors: Jonathan W. Goodwin, Braintree, MA (US); Donald P. Amaral, Jr., Seekonk, MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/327,189

(22) Filed: Dec. 20, 2002

(51) Int. Cl.[7] ................................................. H05K 7/20
(52) U.S. Cl. ......................... 361/719; 24/458; 257/719
(58) Field of Search ................................ 361/703, 704, 361/709–712, 717–719; 257/718, 719, 722, 726, 727; 165/80.3, 185; 174/16.3; 248/505, 510; 267/150, 158, 160; 24/625, 453, 457, 458; 439/485

(56) References Cited

U.S. PATENT DOCUMENTS

| | | | |
|---|---|---|---|
| 5,396,402 A | * | 3/1995 | Perugini et al. ............. 361/704 |
| 5,880,930 A | | 3/1999 | Wheaton .................... 361/690 |
| 6,390,475 B1 | | 5/2002 | Eckblad et al. ............. 277/312 |
| 6,392,887 B1 | * | 5/2002 | Day et al. .................... 361/704 |
| 6,442,045 B1 | | 8/2002 | Goodwin et al. ........... 361/816 |
| 6,469,893 B1 | * | 10/2002 | Frutschy et al. ............ 361/700 |

* cited by examiner

*Primary Examiner*—G. Tolin

(57) ABSTRACT

A mounting system for an integrated circuit employs a novel load cell having a backing plate, a bow spring and a load distribution plate. The load cell controls the loading forces on contacts of an integrated circuit socket. A heat sink having a base includes a pedestal extending from the base that abuts the integrated circuit for purposes of heat removal. Springs are employed to provide loading forces for the heat sink that are lower than the loading forces for the integrated circuit socket contacts.

24 Claims, 7 Drawing Sheets

INTEGRATED CIRCUIT MOUNTING SYSTEM WITH SEPARATE LOADING FORCES FOR SOCKET AND HEAT SINK

CROSS REFERENCE TO RELATED APPLICATIONS n/a

STATEMENT REGARDING FEDERALLY SPONSORED RESEARCH OR DEVELOPMENT n/a

BACKGROUND OF THE INVENTION

The present invention relates to mounting techniques for semiconductor devices and more specifically to a method and system for providing different loading forces for a semiconductor device and an associated heat sink.

Semiconductor devices are often mounted to a printed circuit board via a semiconductor device socket. By mounting a semiconductor device in this manner, the device may be readily removed and replaced in the event of a device failure.

Semiconductor device packages take a number of forms. In a lidded semiconductor device, a semiconductor die is mounted to a substrate. A heat spreader plate having a cavity on the underside of the plate that is sized to receive the die is mounted to the substrate with the die positioned within the cavity. Thermal epoxy is underfilled in the cavity surrounding the die. This structure provides mechanical rigidity for the semiconductor device and allows for heat removal from the die. More specifically, heat removal from the semiconductor die may be accomplished by abutting a heat sink to the top surface of the heat spreader plate. Heat is conveyed from the die to the thermal epoxy and from the thermal epoxy to the heat spreader plate and the abutting heat sink. To obtain efficient heat removal, the heat sink must apply sufficient force to the top surface of the lidded device to achieve good thermal conductivity.

The above-described technique achieves less that optimal heat removal since thermal epoxy is not an ideal conductor of heat. The failure to adequately remove heat from a semiconductor device can result in the failure of the device.

Recognizing that thermal epoxy does not provide a highly efficient medium for heat removal from the semiconductor die, in some systems, lidless semiconductor devices are employed and a heat sink is placed in abutting relation with the die to achieve better heat conductivity to the heat sink. Lidless semiconductor devices that have a ball grid array have been soldered directly to a circuit board. A heat sink has been mounted above such devices and pressure has been applied to the heat sink to urge the heat sink against the top surface of the die so as to provide an effective thermally conductive interface between the top surface of the die and the heat sink.

While it is desirable to employ sockets for the mounting of semiconductor devices, the mounting of a lidless semiconductor device such as a land grid array (LGA) device is problematic. A minimum pressure is required to assure proper electrical conductivity between the contacts on the underside on an LGA device and associated conductive contacts which may comprise elastomeric columnar contacts within an Metalized Particle Interconnect (MPI) socket. Considerably less pressure is required to provide proper thermal conductivity between a heat sink and the top surface of a lidless device. The application of forces to the top surface of the semiconductor device that are sufficient to obtain good electrical conductivity between the semiconductor device contacts and the socket contacts may result in damage to the semiconductor die.

Accordingly it would be desirable to be able to mount a lidless or lidded semiconductor device within a socket, such as an LGA socket in a manner that provides the forces needed to assure proper electrical conductivity at the respective conductive contact interfaces while not subjecting the semi-conductor die to potential damage as a consequence of expressive forces imported by a heat sink.

BRIEF SUMMARY OF THE INVENTION

In accordance with the present invention, a mounting system for a semiconductor device is disclosed that maintains a first predetermined compressive force on the contacts of a semiconductor socket, such as an MPI socket, and which allows for the application of a second lesser predetermined force to be applied by a heat sink surface to a semiconductor device so as to obtain desired heat removal from the device during use. The first predetermined compressive force is obtained via a novel load cell. The load cell includes a backer plate having shouldered standoffs mounted in respective corners of the backer plate, a load distribution plate having openings in the respective corners that align with the shouldered standoffs to allow passage of the shouldered standoffs therethrough, and a bow spring comprising a 3-dimensional spring metal structure having flanges extending outward from a raised center portion. The bow spring is disposed between the backer plate and the load distribution plate and the backer plate is captively affixed to the load distribution plate using flanges that wrap around the lower surface of the backer plate and pre-load the load cell.

The shouldered standoffs extend through holes in an insulator and a printed circuit board. A semiconductor device socket, such as an MPI socket, is precisely positioned on the opposing side of the printed circuit board from the load cell such that the socket contacts mate with corresponding conductive contacts on the circuit board. A semiconductor device is disposed within the socket and a pressure plate is disposed in abutting relation with the exterior periphery of the top surface of the semiconductor device. The shouldered standoffs extend through holes provided in the pressure plate. The semiconductor device and the semiconductor device socket are compressively loaded ;by drawing the pressure plate toward the load cell via nuts applied to screw threads on the shouldered standoffs, via cams, or via any suitable lever mechanism.

A heat sink having a base has a pedestal extending from the base that contacts the semiconductor die or a lid on a lidded semiconductor. The pedestal is urged into abutting contact with the semiconductor via springs that engage the pressure plate and control the force applied to the semiconductor die or lid.

Other features, aspects and advantages of the above-described load cell and integrated circuit mounting system will be apparent from the Detailed Description of the Invention that follows.

BRIEF DESCRIPTION OF THE SEVERAL VIEWS OF THE DRAWING

The invention will be more fully understood by reference to the following Detailed Description of the Invention in conjunction with the Drawing of which:

FIG. 3b is a bottom perspective view of the load cell assembly of FIG. 3a;

DETAILED DESCRIPTION OF THE INVENTION

Figure 1:
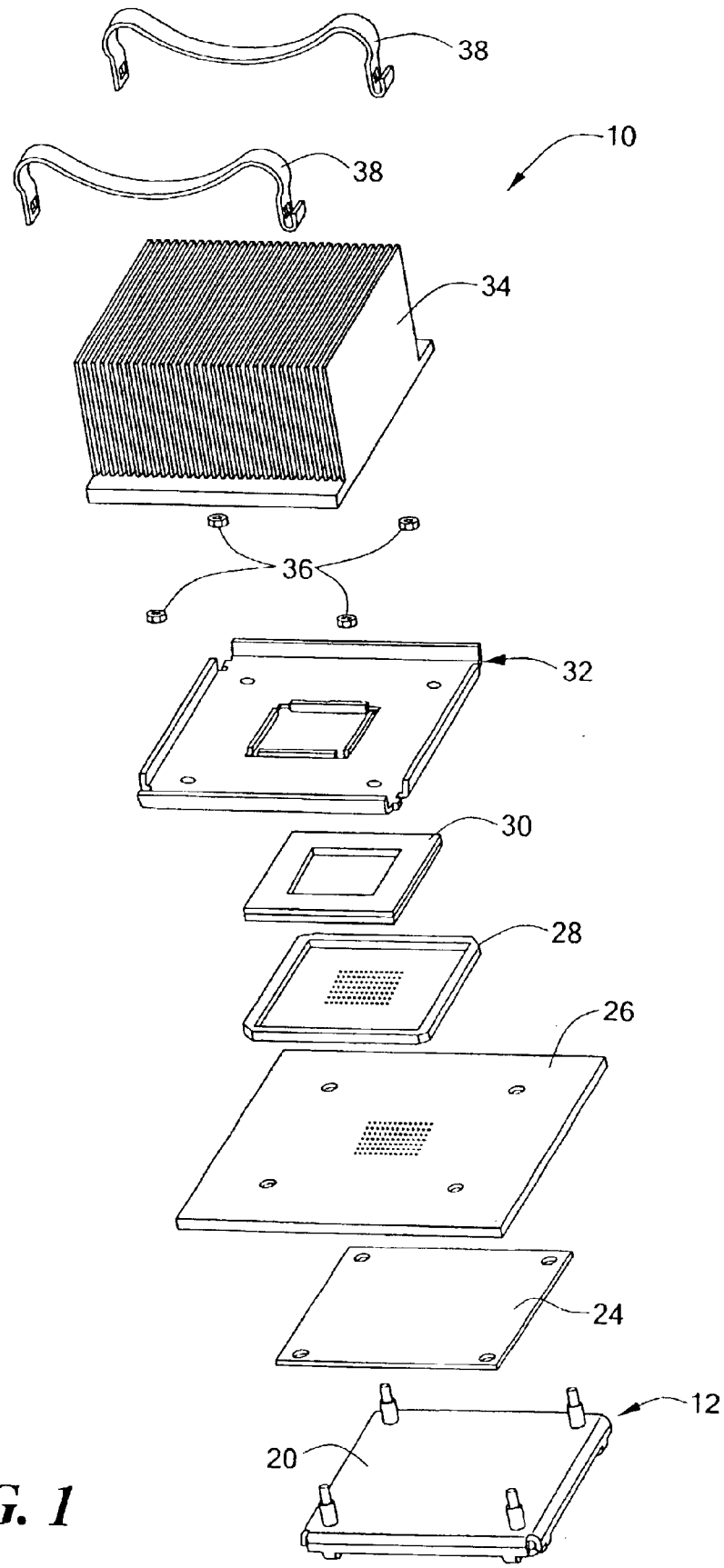
FIG. 1 is an exploded perspective view of a semiconductor mounting system in accordance with the present invention.
Figure 2:
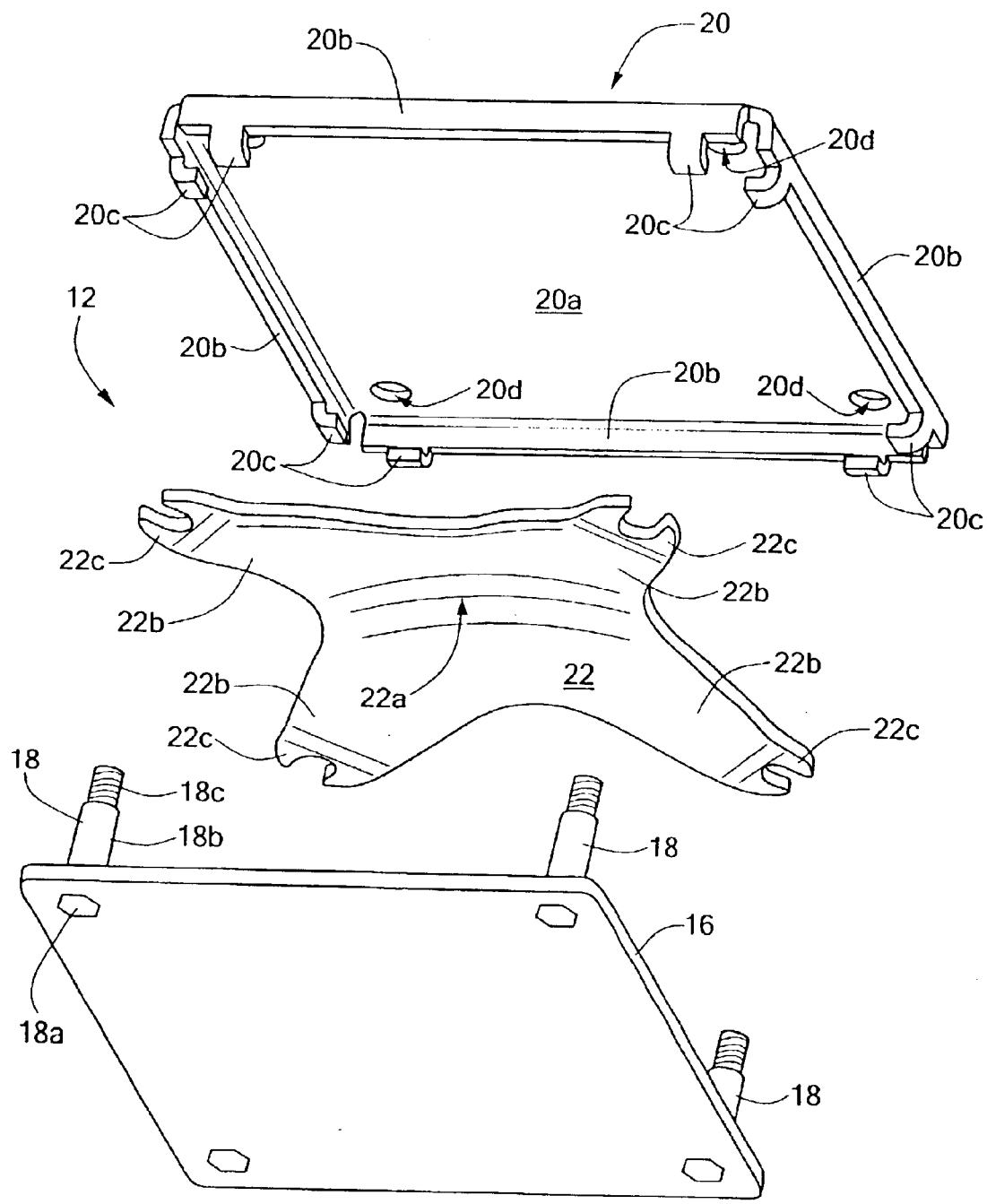
FIG. 2 is an exploded perspective view of the load cell employed in the mounting system depicted in FIG. 1.

In accordance with the present invention a mounting system for an integrated circuit, such as a Land Grid Array (LGA) integrated circuit is disclosed.

Referring to FIGS. 1–8, the mounting system 10 includes a load cell 12 that cooperates with a pressure plate 32 to determine first compressive loading forces that are applied to an integrated circuit 30 and an integrated circuit socket 28. The load cell 12 includes a backer plate 16, a plurality of shouldered standoffs 18 mounted via a press fit into openings in respective corners of the backer plate 16, a load distribution plate 20 and a bow spring 22. In the illustrated embodiment, the backer plate 16 comprises a generally rectangular metal plate. The shouldered standoffs 18 each include a head portion 18a, a cylindrical shaft portion 18b and an end portion 18c at the opposing end of the standoff 18 from the head portion. The end portion 18c of the standoff 18 in the present embodiment comprises a threaded section having a diameter less than the diameter of the cylindrical shaft portion 18b although the end portion may take different forms as is subsequently discussed. Since the end portion 18c has a diameter less than the shaft portion 18b, a shoulder is formed that sets a load height within the mounting system 10. The shouldered standoffs 18 are press fit into openings in the corners of the backer plate 16 and are retained within the backer plate 16 via an interference fit. The head portion of the shouldered standoff may have a non-circular cross-section that fits within a recess that is configured to prevent rotation of the shouldered standoff 18 within the backer plate 16.

The bow spring 22 is fabricated of spring steel or any other suitable spring material. More specifically, the bow spring 22 has a dome like raised center region 22a and four legs 22b that extend outward toward notched feet 22c. The bow spring 22 is positioned with the feet 22c in abutting relation with the backer plate 16 such that the standoffs 18 extend through the notched. feet 22c.

The load distribution plate 20 comprises a generally rectangular sheet metal component having a plate portion 20a, downwardly extending side portions 20b, retention flanges 20c and openings 20d within respective corners of the central plate portion 20a. The openings 20d are aligned with the standoffs 18 mounted in the backer plate 16 and are sized to allow the cylindrical shaft portion of the shouldered standoffs 18 to pass freely through the respective openings 20d when the load cell 12 is assembled.

Figure 3A:
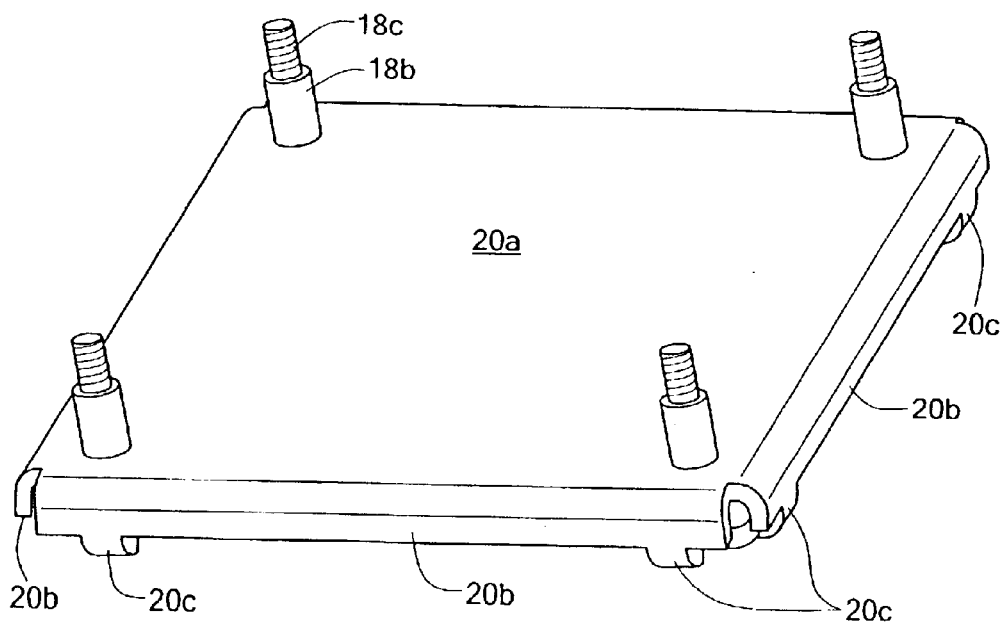
FIG. 3a is a top perspective view of the load cell assembly.
Figure 3B:
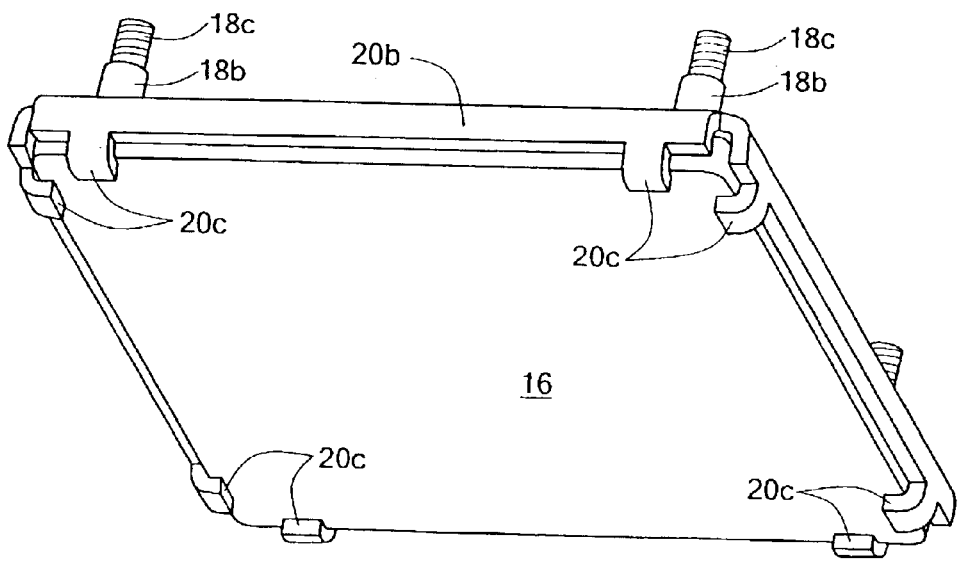
Figure 4:
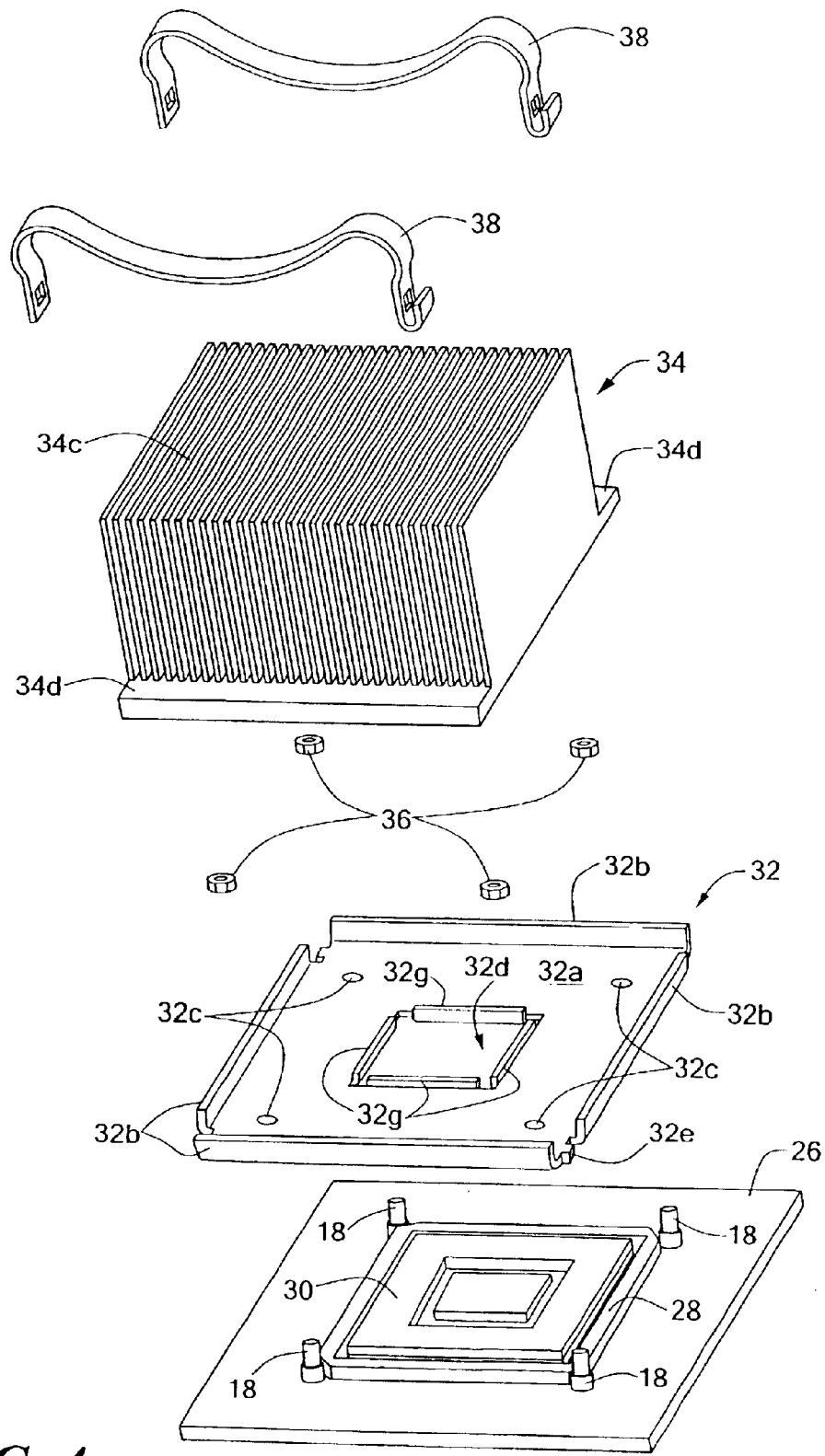
FIG. 4 is a perspective view of a partially assembled integrated circuit mounting system of the type depicted in FIG. 1 prior to mounting of the pressure plate and the heat sink.
Figure 5:
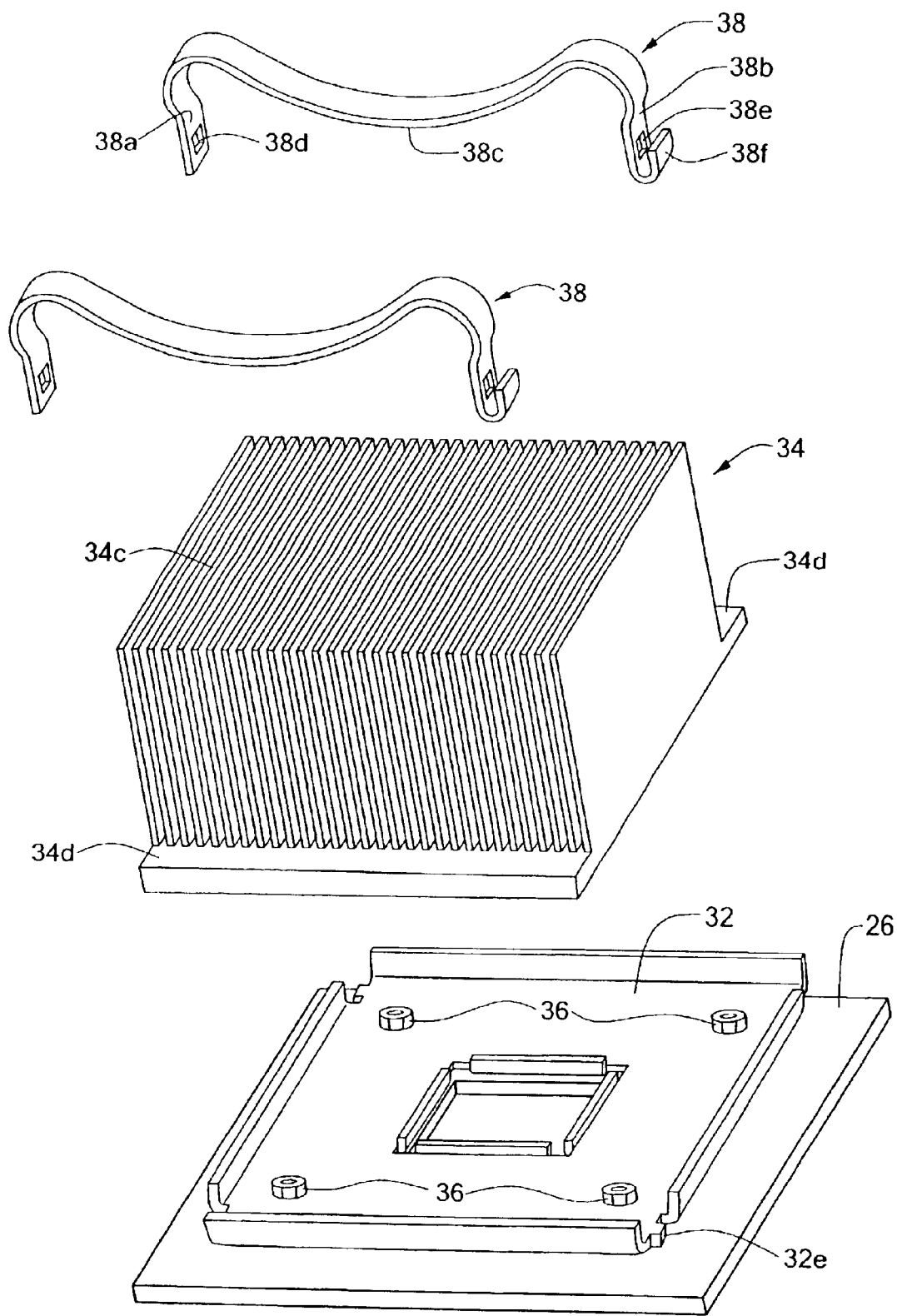
FIG. 5 is a perspective view of a partially assembled integrated circuit mounting system after mounting of the pressure plate but prior to mounting of the heat sink.
Figure 6:
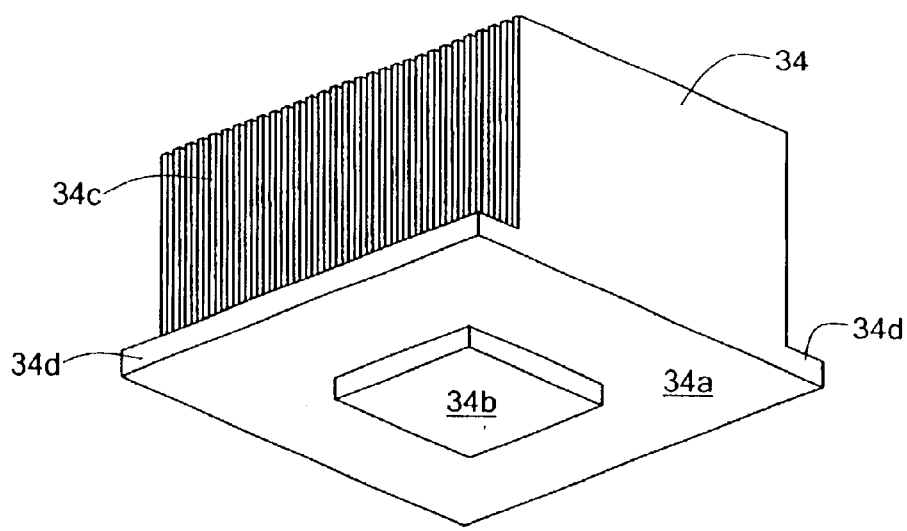
FIG. 6 is a bottom perspective view of the heat sink.
Figure 7:
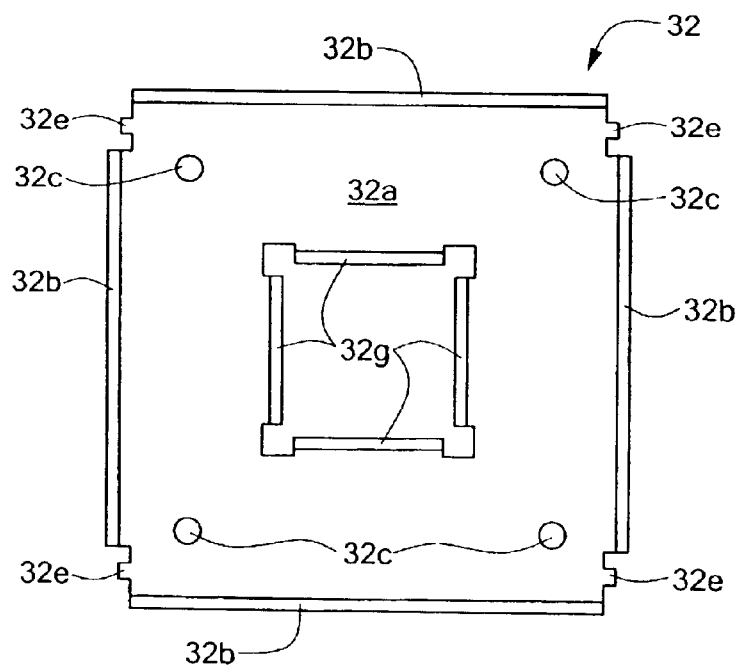
FIG. 7 is a top plan view of the pressure plate.
Figure 8:
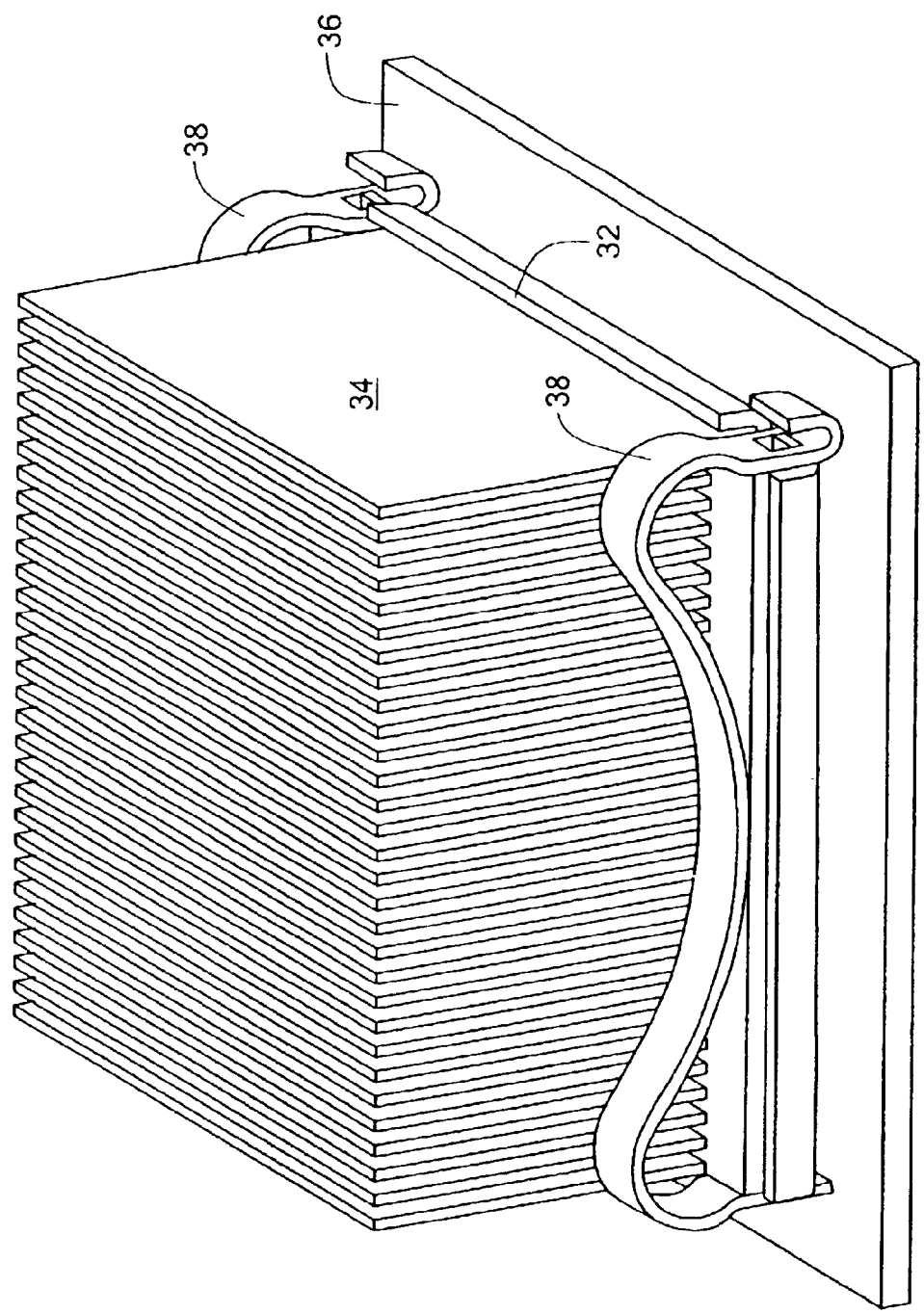
FIG. 8 is a perspective view of the fully assembled integrated circuit mounting system.

During assembly of the load cell 12, the bow spring 22 is positioned on the backer plate 16 with the notched feet 22c straddling the cylindrical shaft portion 18b of the shouldered standoffs 18 and abutting the backer plate 16. The domed portion of the bow spring 22 abuts the underside of the load distribution plate 20 in the central region of the plate 20 so as to distribute the spring force fairly evenly among the standoffs 18 when the load cell is mounted within the presently disclosed integrated circuit mounting system. The load distribution plate 20 is positioned over the bow spring 22 such that the shouldered standoffs 18 extend through the openings in the corners of the load distribution plate 20. The load cell 12 components, comprising the load distribution plate 20, the bow spring 22 and the backer plate 16 are compressed and the retention flanges 20c are bent so as to wrap around the underside of the backer plate 16 as depicted in FIGS. 3a and 3b. The load cell 12 is thus preloaded so as to require a minimum force to further compress the load cell 12 against the bow spring 22 sandwiched between the load distribution plate 20 and the backer plate 16.

An insulator 24 is optionally disposed between the load distribution plate 20 of the load cell 12 and a printed circuit board (PCB) 26 to prevent the shorting of conductive traces that may be present on the side of the PCB facing the load distribution plate 20. The insulator 24 in the illustrated embodiment comprises a generally rectangular sheet having holes in respective corners of the insulator 24 and sized to allow passage of the shouldered standoffs 18 therethrough.

The PCB 26 has first and second opposing surfaces. The first surface of the PCB 26 is adjacent the insulator 24 when assembled within the mounting system. The PCB 26 also has holes sized and positioned to allow the passage of the shouldered standoffs 18 therethrough. Additionally, the PCB 26 includes precisely positioned alignment holes (not shown) that allow for the alignment of a socket 28 on the second surface of the PCB 26. The socket 28 may comprise an MPI socket or any other suitable socket 28 adapted for conductively coupling electrical contacts of an integrated circuit 30 to corresponding conductive contacts on the PCB 26 (not shown). The socket 28 typically includes alignment pins (not shown) that cooperate with the alignment holes in the PCB 26 to precisely position the socket 28 with respect to conductive contacts on the PCB 26. The socket 28 is disposed on the second surface of the PCB 26 with the alignment pins of the socket 28 engaging respective alignment holes.

The integrated circuit 30, which may comprise a lidded or a lidless integrated circuit, is inserted into the socket 28. The integrated circuit 30 typically includes a generally planar top surface along its periphery that allows for the application of compressive force to the integrated circuit 30 so as to generate a good conductive contact at the interfaces between the integrated circuit 30 and socket 28 contacts and between the socket 28 and contacts of the PCB 26. It should be recognized that in the circumstance in which a socket 28 is soldered to the PCB compressive force is not relevant to the quality of the interconnection at that interface. The integrated circuit 30 typically includes a central cavity in which the semiconductor die for the integrated circuit is mounted. The die may be exposed or alternatively, may have a lid mounted over the die. Heat may be removed from the integrated circuit 30 via a heat sink 34 as subsequently discussed.

The pressure plate 32 comprises a generally rectangular metal plate 32a having side flanges 32b that extend generally at right angles with respect to the metal plate 32a to increase the stiffness of the pressure plate 32. The pressure plate 32 further includes openings 32c sized and positional to allow the shouldered standoffs 16 to pass theretlirough and a central opening 32d that exposes the central cavity of the integrated circuit 30 when the pressure plate 32 is disposed in a mounting position with the shouldered standoffs 18 extending through respective corner holes 32c in the pressure plate 32 In the illustrated embodiment, the central opening 32d comprises a generally rectangular opening in the pressure plate 32 although any opening that is suitably shaped may be employed that allows the heat sink to contact the dic or lid of the integrated circuit 30. The pressure plate 32 further includes nibs 32e that extend from the pressure 32 at respective corners and that are employed in the mounting of a heat sink 34 as is later discussed in greater detail. Flanges 32g extend generally at right angles fromt the plate 32a around the periphery of the opening 32d to further stiffen the plate 32a.

Following the insertion of the integrated circuit 30 within the socket 28 the pressure plate 32 is disposed over the integrated circuit 30. Compressive forces are applied to the socket 28 contact interfaces with the PCB 26 and the integrated circuit 30 by urging the pressure plate 32 into abutting relation with the shoulders of the shouldered standoffs 18. In the illustrated embodiment this is accomplished by positioning the pressure plate 32 such that the threaded section of the shouldered standoffs 18 extend through the openings 32c in the corners of the pressure plate 32 and by screwing mounting nuts 36 onto the. threaded sections of the shouldered standoffs 18 so that the pressure plate 32 bottoms out against the shoulders of the shouldered standoffs 18. Tightening of the mounting nuts 36 compresses the bow spring 22 within the load cell 12 so as to obtain the desired compressive force on the top surface of the integrated circuit 30 which is imparted by the pressure plate 32. The compressive forces imparted on the top surface of the integrated circuit 30 are distributed over the socket 28 contacts. By pre-loading the load cell 12, final assembly can be accomplished with a low z axis deflection which, in one embodiment, is approximately 0.050 inch.

While mounting nuts 36 are threaded onto the threaded end sections of the shouldered standoffs 18 to obtain the desired z axis force loading on the socket 28 contacts in the illustrated embodiment, any other suitable technique for applying the final loading via the load cell 12 may be employed. For example, the end sections of the shouldered standoffs may have enlarged heads that are cooperative with a cam, a lever, or a wedge to impart the desired loading on the socket 28 contacts.

In the circumstance in which it is desirable to employ a heat sink 34 for heat removal from the integrated circuit 30 the heat sink 34 is mounted to the pressure plate 32 after the mounting of the pressure plate 32 as described above. The heat sink 34 includes a base 34a, a pedestal 34b extending downward from the base 34a and a plurality of upstanding fins 34c. The base 34a extends outboard of the fins 34c on opposing sides of the heat sink 34 so as to provide opposing mounting flanges 34d. The heat sink 34 in the illustrated embodiment is mounted to the pressure plate 32 using a pair of retention springs 38.

The retention springs 38 each include generally vertical first and second pressure plate coupling portions 38a, 38b respectively, having an upper end and a lower end and a curved downward extending central portion 38c coupling the upper end of the first pressure plate coupling portion 38a to the upper end of the second pressure plate coupling portion 38b. The first and second pressure plate coupling portions 38a, 38b have openings 38d, 38e in their respective lower ends that are sized to receive the nibs 32e that extend from the corners of the pressure plate 32. Additionally, the retention springs 38 each optionally include a u-shaped tail 38f at the lower end of the pressure plate coupling portion 38b that facilitates installation and removal of the retention spring 32.

To mount the heat sink 34, the heat sink 34 is aligned in a heat sink mounting position over the pressure plate 32 with the pedestal 34b protruding into the central opening 32d of the pressure plate 32 and contacting the lid or die of the integrated circuit 30. When disposed in the heat sink mounting position, the mounting flanges 34d are disposed generally parallel to a line through the opposed outwardly projecting nibs 32e. To secure the heat sink 34 to the pressure plate 32, the two retention springs 38 are mounted to the pressure plate 32 with the nibs 32e disposed in openings 38d, 38e of respective pressure plate coupling portions 38a, 38b. When so mounted, the central portion 38c of the retention springs 38 exert a downward force on the top surface of the respective mounting flanges 34d of the heat sink 34 to provide the desired force on the lid or die of the integrated circuit 30 by the heat sink pedestal 34b. The force exerted on the integrated circuit 30 die or lid is typically considerably lower than the forces exerted by the load cell 12 to avoid damage to the integrated circuit 30.

While a single bow spring 22 is illustrated in the above-described embodiment, multiple stacked spring members of lesser thickeness may be employed in place of a single thicker spring member to avoid stress stiffening that would be associated with a single thick spring member.

It will be appreciated by those of ordinary skill in the art that modifications to and variations of the above-described load cell and mounting system may be made without departing from the inventive concepts disclosed herein. Accordingly, the invention is not to be viewed as limited except as by the scope and spirit of the appended claims.

What is claimed is:

1. Semiconductor mounting apparatus comprising:

a printed circuit board having first and second opposing surfaces and having a plurality of conductive contacts arranged in a predetermined pattern on said first surface;

a socket having a plurality of contacts arranged in said predetermined pattern, said socket being disposed on and aligned with said printed circuit board first surface such that said socket contacts are in conductive abutting relation with said printed circuit board contacts;

an integrated circuit having a contact surface, a heat transfer surface and an upper surface, said integrated circuit having a plurality of contacts on said contact surface arranged in said predetermined pattern, said integrated circuit being disposed in said socket and positioned such that said integrated circuit contacts are in conductive abutting relation with said socket contacts;

a pressure plate disposed in abutting relation with said integrated circuit upper surface, said pressure plate having an opening therethrough;

a load cell including a first spring member, said load cell disposed adjacent said second surface of said printed circuit board;

a linkage extending through at least one opening in said printed circuit board and coupling said load cell to said pressure plate, said load cell being operative to apply to said upper surface of said integrated circuit a first force through said linkage and said pressure plate;

a heat sink having a bottom surface extending through said opening in said pressure plate and abutting said heat transfer surface of said integrated circuit when said heat sink is disposed in a mounting position with respect to said pressure plate;

at least one second spring member coupled to said pressure plate, said second spring member abutting said heat sink and urging said heat sink bottom surface toward said heat transfer surface of said integrated circuit with a second force.

2. The semiconductor mounting apparatus of claim 1 wherein said linkage comprises a plurality of posts.

3. The semiconductor mounting apparatus of claim 2 wherein said plurality of posts comprise a plurality of shouldered standoffs having respective shoulder regions and said pressure plate is captively retained in abutting relation with said shoulder regions of said shouldered standoffs.

4. The semiconductor mounting apparatus of claim 3 wherein said shouldered standoffs include a threaded end portion and said pressure plate is captively retained by nuts threaded onto said threaded portion of said shouldered standoffs.

5. The semiconductor mounting apparatus of claim 1 wherein said load cell comprises:

a backer plate having edges and first and second opposing surfaces, said backer plate having holes in respective corners of the backer plate;

a load distribution plate having a plurality of flanges extending from respective sides of said load distribution plate, said second surface of said backer plate oriented to face said load distribution plate and said flanges being configured to abut said first surface of said backer plate to captively retain said backer plate in spaced relation from said load distribution plate; and wherein:

said first spring member is disposed between said load distribution plate and said backer plate, said first spring member being operative to urge said backer plate away from said load distribution plate; and said linkage is coupled to said backer plate of said load cell.

6. The semiconductor mounting apparatus of claim 5 wherein said first spring member includes a generally dome-shaped central portion and a plurality of legs extending outward from said central portion.

7. The semiconductor mounting apparatus of claim 1 wherein said integrated circuit includes an exposed semiconductor die and said a heat sink has a pedestal extending from said heat sink bottom surface, said pedestal extending through said pressure plate and abutting said die when said heat sink is disposed in a mounting position with respect to said pressure plate.

8. The semiconductor mounting apparatus of claim 7 wherein said heat sink includes a pair of generally planar flange members and said heat sink is mounted to said pressure plate via a plurality of second spring members that engage said pressure plate, contact respective flanges of said heat sink and urge said heat sink toward said pressure plate with said second force.

9. The semiconductor mounting apparatus of claim 1 wherein said integrated circuit includes a lid and said heat sink has a pedestal extending from said heat sink bottom surface, said pedestal extending through said pressure plate and abutting said lid when said heat sink is disposed in a mounting position with respect to said pressure plate.

10. The semiconductor mounting apparatus of claim 9 wherein said heat sink includes a pair of generally planar flange members and said heat sink is mounted to said pressure plate via a plurality of second spring members that engage said pressure plate, contact respective flanges of said heat sink and urge said heat sink toward said pressure plate with said second force.

11. The semiconductor mounting apparatus of claim 1, wherein the first force is different than the second force.

12. The semiconductor mounting apparatus of claim 11, wherein the first force is greater than the second force.

13. Apparatus for mounting an integrated circuit to printed circuit board, said integrated circuit having a top surface, a contact surface and a plurality of contacts arranged in a predetermined pattern on said contact surface, said printed circuit board having a corresponding plurality of contacts arranged in said predetermined pattern on a first surface of said printed circuit board, said printed circuit board further including a second surface opposing said first surface, said apparatus comprising:

a first mechanical linkage engaging said integrated circuit and said printed circuit board for mounting said integrated circuit to said board with said, plurality of contacts of said integrated circuit conductively coupled to said corresponding plurality of said contacts of said printed circuit, board, said first mechanical linkage including at least one first spring member configured to urge said integrated circuit towards said printed circuit board with a first force;

a heat sink having a bottom surface; and a second mechanical linkage engaging said heat sink and at least a portion of said first mechanical linkage, said second mechanical linkage including at least one second spring member for establishing a second force to urge said heat sink bottom surface into generally abutting relation with said integrated circuit top surface.

14. The apparatus of claim 13, wherein the first force is different than the second force.

15. The apparatus of claim 14, wherein the first force is greater than the second force.

16. The apparatus of claim 13 further including a load cell, wherein said first spring member comprises a portion of said load cell.

17. The apparatus of claim 16, wherein the first spring member comprises a bow spring.

18. The apparatus of claim 16 wherein said load cell is disposed adjacent said second surface of said printed circuit board.

19. The apparatus of claim 18 further including an insulator disposed between said load cell and said second surface of said printed circuit board.

20. The apparatus of claim 13, wherein said first mechanical linkage includes a pressure plate engaging the integrated circuit top surface.

21. The apparatus or claim 20 wherein said second mechanical linkage engages said heat sink and said pressure plate.

22. The apparatus of claim 21 wherein said second spring member includes first and second opposing side portions joined by a resilient arcuate center portion, said side portions having respective ends, said second spring member configured such that said ends engage said pressure plate and said arcuate center portion abuts said heat sink.

23. The apparatus of claim 13, further comprising:

a socket having through-contacts arranged in said predetermined pattern, said socket disposed between said printed circuit board first surface and said integrated circuit contact surface, said through-contacts of said socket conductively coupling said plurality of printed circuit board contacts to said corresponding plurality of integrated circuit contacts.

24. A semiconductor mounting system comprising:

an integrated circuit having a top surface, a contact surface and a plurality of contacts arranged in a predetermined pattern on said contact surface;

a printed circuit board having a corresponding plurality of contacts arranged in said predetermined pattern on a first surface of said printed circuit board, said printed circuit board further including a second surface opposing said first surface;

a socket having through-contacts arranged in said predetermined pattern, said socket disposed between said printed circuit board first surface and said integrated circuit contact surface, said through-contacts of said socket conductively coupling said plurality of printed circuit board contacts to said corresponding plurality of integrated circuit contacts;

a first mechanical linkage engaging said integrated circuit and said printed circuit board for mounting said integrated circuit to said board with said plurality of contacts of said integrated circuit conductively coupled to said corresponding plurality of said contacts of said printed circuit board, said first mechanical linkage including at least one spring member configured to urge said integrated circuit towards said printed circuit board with a first force;

a heat sink having a bottom surface; and a second mechanical linkage engaging said heat sink and at least a portion of said first mechanical linkage, said second mechanical linkage including at least one second spring member for establishing a second force to urge said heat sink bottom surface into generally abutting relation with said integrated circuit top surface.

* * * * *